US011129280B2

(12) United States Patent
Lee et al.

(10) Patent No.: US 11,129,280 B2
(45) Date of Patent: Sep. 21, 2021

(54) ELECTRONIC COMPONENT-EMBEDDED SUBSTRATE

(71) Applicant: SAMSUNG ELECTRO-MECHANICS CO., LTD., Suwon-si (KR)

(72) Inventors: Young Kwan Lee, Suwon-si (KR); Kyung Hwan Ko, Suwon-si (KR); Kyoung Jun Kim, Suwon-si (KR); Yong Hoon Kim, Suwon-si (KR); Seung Eun Lee, Suwon-si (KR); Hak Chun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/806,104

(22) Filed: Mar. 2, 2020

(65) Prior Publication Data
US 2021/0195750 A1     Jun. 24, 2021

(30) Foreign Application Priority Data
Dec. 24, 2019  (KR) ........................ 10-2019-0173591

(51) Int. Cl.
*H05K 1/18* (2006.01)
*H05K 1/11* (2006.01)

(52) U.S. Cl.
CPC ............ *H05K 1/185* (2013.01); *H05K 1/115* (2013.01); *H05K 2201/10015* (2013.01); *H05K 2201/10515* (2013.01); *H05K 2201/10522* (2013.01)

(58) Field of Classification Search
CPC ......... H05K 1/185; H05K 2201/10515; H05K 2201/1053; H05K 2201/10522;
(Continued)

(56) References Cited

U.S. PATENT DOCUMENTS

2006/0083895 A1* 4/2006 Ikeda ........................ B32B 7/02
                                                                  428/137
2007/0035015 A1* 2/2007 Hsu ...................... H01L 23/5389
                                                                  257/723
(Continued)

FOREIGN PATENT DOCUMENTS

JP          2006-339276 A    12/2006
KR         10-1514518 B1     4/2015

*Primary Examiner* — Roshn K Varghese
(74) *Attorney, Agent, or Firm* — Morgan, Lewis & Bockius LLP

(57) ABSTRACT

An electronic component-embedded substrate includes an electronic component module having a first surface and a second surface opposite to the first surface, and including a first support member having a first through-portion, a first electronic component disposed in the first through-portion, a first resin layer covering at least a portion of the first electronic component, a second support member disposed on one side of the first support member and having a second through-portion, a second electronic component disposed in the second through-portion and connected to the first electronic component, and a second resin layer covering at least a portion of the second electronic component, an insulating material covering at least a portion of each of a side surface of the electronic component module and the first surface, and a first wiring layer disposed on the insulating material and connected to the first electronic component.

17 Claims, 11 Drawing Sheets

(58) Field of Classification Search
CPC .......... H05K 2201/10651; H05K 2201/10636; H05K 2201/10015; H05K 1/183; H05K 1/184; H05K 1/186; H01L 23/49827; H01L 23/49833; H01L 25/117
See application file for complete search history.

(56) References Cited

U.S. PATENT DOCUMENTS

| | | | |
|---|---|---|---|
| 2007/0074901 A1* | 4/2007 | Takizawa | H05K 3/4614 |
| | | | 174/261 |
| 2013/0082399 A1* | 4/2013 | Kim | H01L 24/97 |
| | | | 257/774 |
| 2014/0347834 A1 | 11/2014 | Lee et al. | |
| 2018/0145033 A1* | 5/2018 | Yi | H01L 23/49838 |
| 2018/0374648 A1* | 12/2018 | Na | H01G 4/248 |

* cited by examiner

ELECTRONIC COMPONENT-EMBEDDED SUBSTRATE

CROSS-REFERENCE TO RELATED APPLICATION(S)

This application claims the benefit under 35 USC 119(a) of Korean Patent Application No. 10-2019-0173591 filed on Dec. 24, 2019 in the Korean Intellectual Property Office, the entire disclosures of which are incorporated herein by reference for all purposes.

TECHNICAL FIELD

The present disclosure relates to an electronic component-embedded substrate.

BACKGROUND

Recently, electronic devices are required to have high performance and high functionality, while being thinned and miniaturized. Accordingly, the number of electronic components to be mounted on the printed circuit board is increasing, but the number of electronic components that may be mounted on the surface of the printed circuit board is limited. Therefore, a technology for an electronic component-embedded substrate in which electronic components such as passive elements and active elements are embedded in a printed circuit board has been developed.

SUMMARY

This summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide an electronic component-embedded substrate having a shortened electrical connection path.

An aspect of the present disclosure is to provide an electronic component-embedded substrate in which a plurality of electronic components are embedded by increasing the mounting density of electronic components.

An aspect of the present disclosure is to provide an electronic component-embedded substrate having improved yield.

An aspect of the present disclosure is to provide an electronic component-embedded substrate in which warpage is reduced.

According to an aspect of the present disclosure, an electronic component-embedded substrate includes an electronic component module having a first surface and a second surface opposite to the first surface, and including a first support member having a first through-portion, a first electronic component disposed in the first through-portion, a first resin layer covering at least a portion of the first electronic component, a second support member disposed on one side of the first support member and having a second through-portion, a second electronic component disposed in the second through-portion and connected to the first electronic component, and a second resin layer covering at least a portion of the second electronic component, an insulating material covering at least a portion of each of a side surface of the electronic component module and the first surface, and a first wiring layer disposed on the insulating material and connected to the first electronic component.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
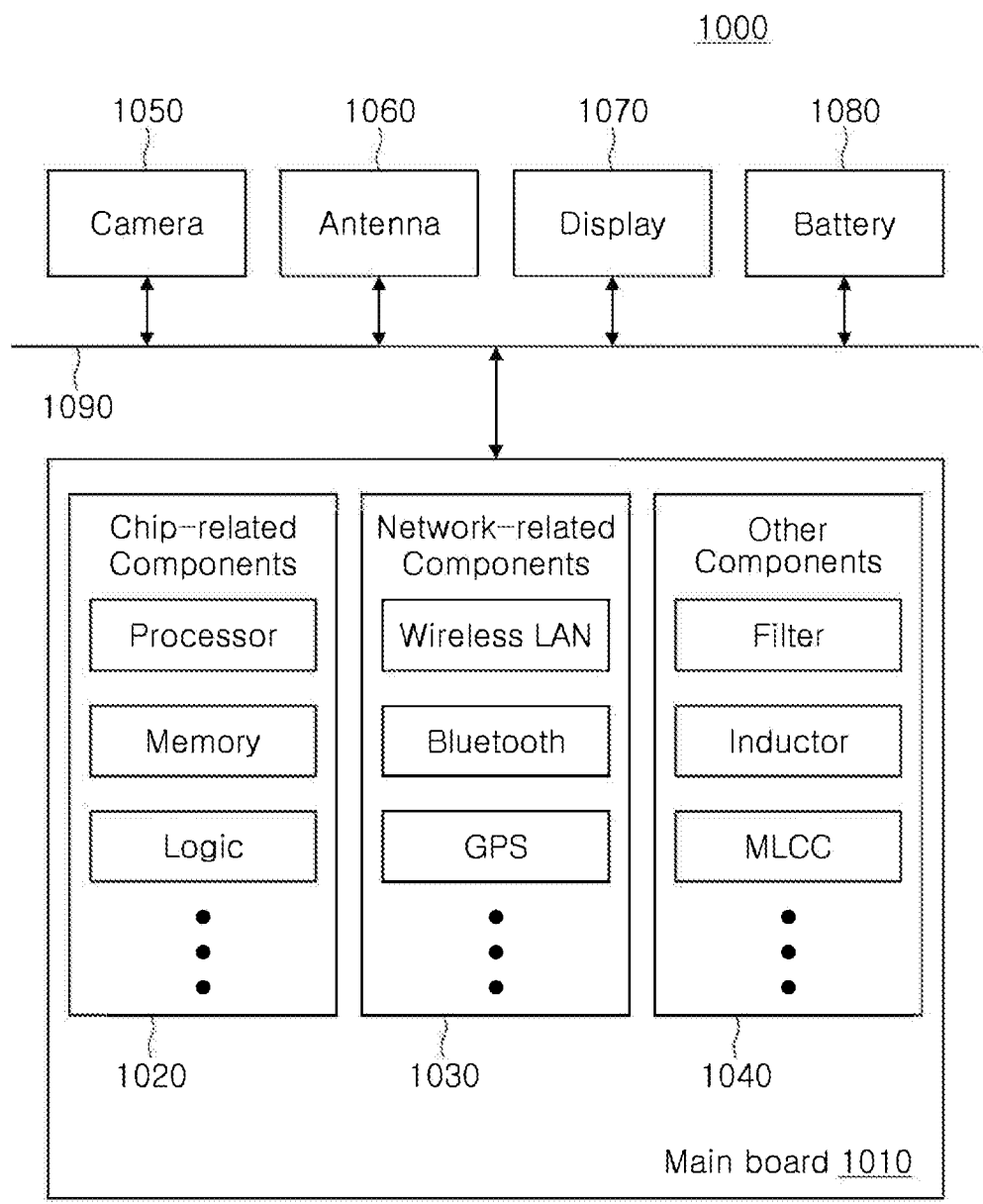
FIG. 1 is a schematic block diagram illustrating an example of an electronic device system according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed, as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the electronic components 1020 may be combined with each other. The chip related component 1020 may have the form of a package including the above-described chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related electronic components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may also be combined with the chip-related electronic component 1020 and/or the network-related electronic component 1030.

Depending on a type of the electronic device 1000, the electronic device 1000 may include other electronic components that may or may not be physically or electrically connected to the mainboard 1010. These other components may include, for example, a camera module 1050, an antenna module 1060, a display device 1070, a battery 1080 and the like, but are not limited thereto. For example, these other components may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, other electronic components used for various uses depending on a type of electronic device 1000, or the like may be used.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
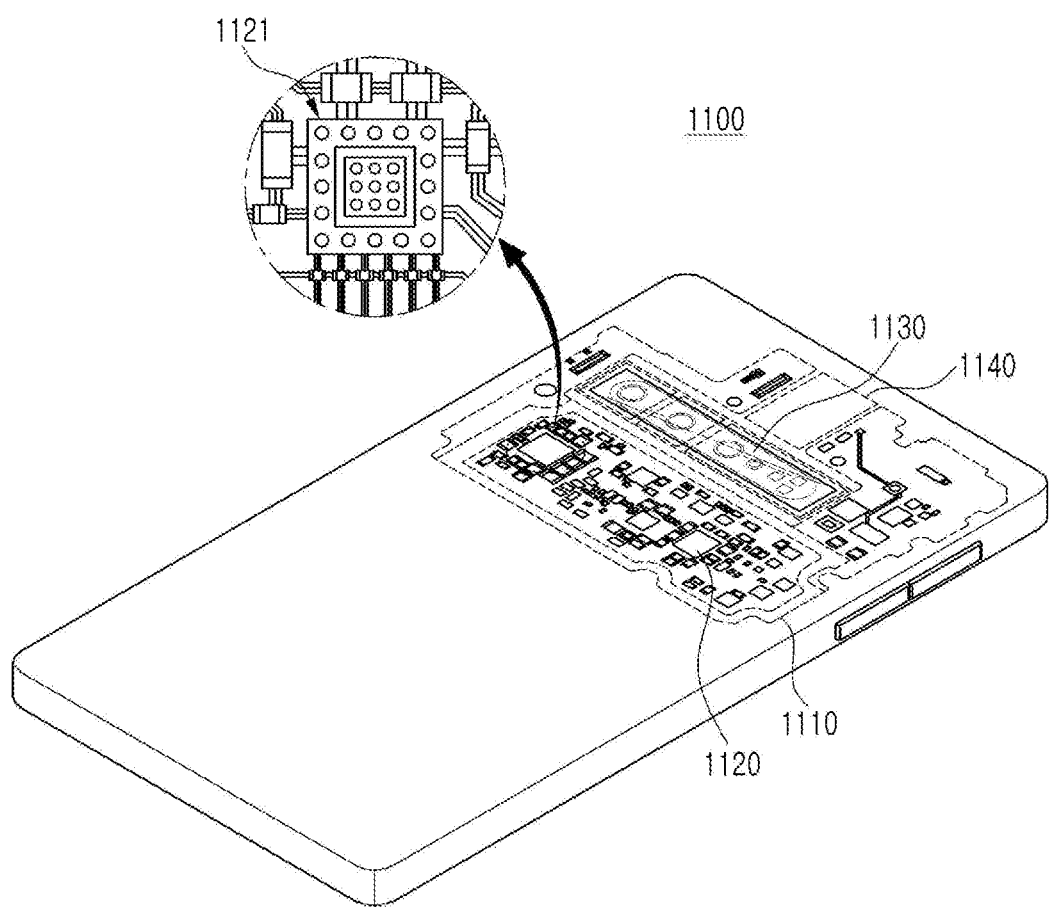
FIG. 2 schematically illustrates a perspective view of an electronic device according to an example.

FIG. 2 is a schematic perspective view of an electronic device according to an example.

Referring to FIG. 2, an electronic device may be, for example, a smartphone 1100. A mainboard 1110 may be accommodated in the smartphone 1100, and various electronic components 1120 may be physically or electrically connected to the mainboard 1110. In addition, other electronic components that may or may not be physically or electrically connected to the mainboard 1110, such as a camera module 1130 and/or a speaker 1140, may be accommodated therein.

Some of the electronic components 1120 may be the chip related components, for example, a semiconductor package 1121, but are not limited thereto. The semiconductor package 1121 may be a surface mounted type in which a device such as a semiconductor chip or a passive component is mounted on a package substrate having a multilayer electronic component-embedded substrate, but is not limited thereto. On the other hand, the electronic device is not necessarily limited to the smartphone 1100, and may be another electronic device as described above.

Electronic Component Embedded-Substrate

Figure 3:
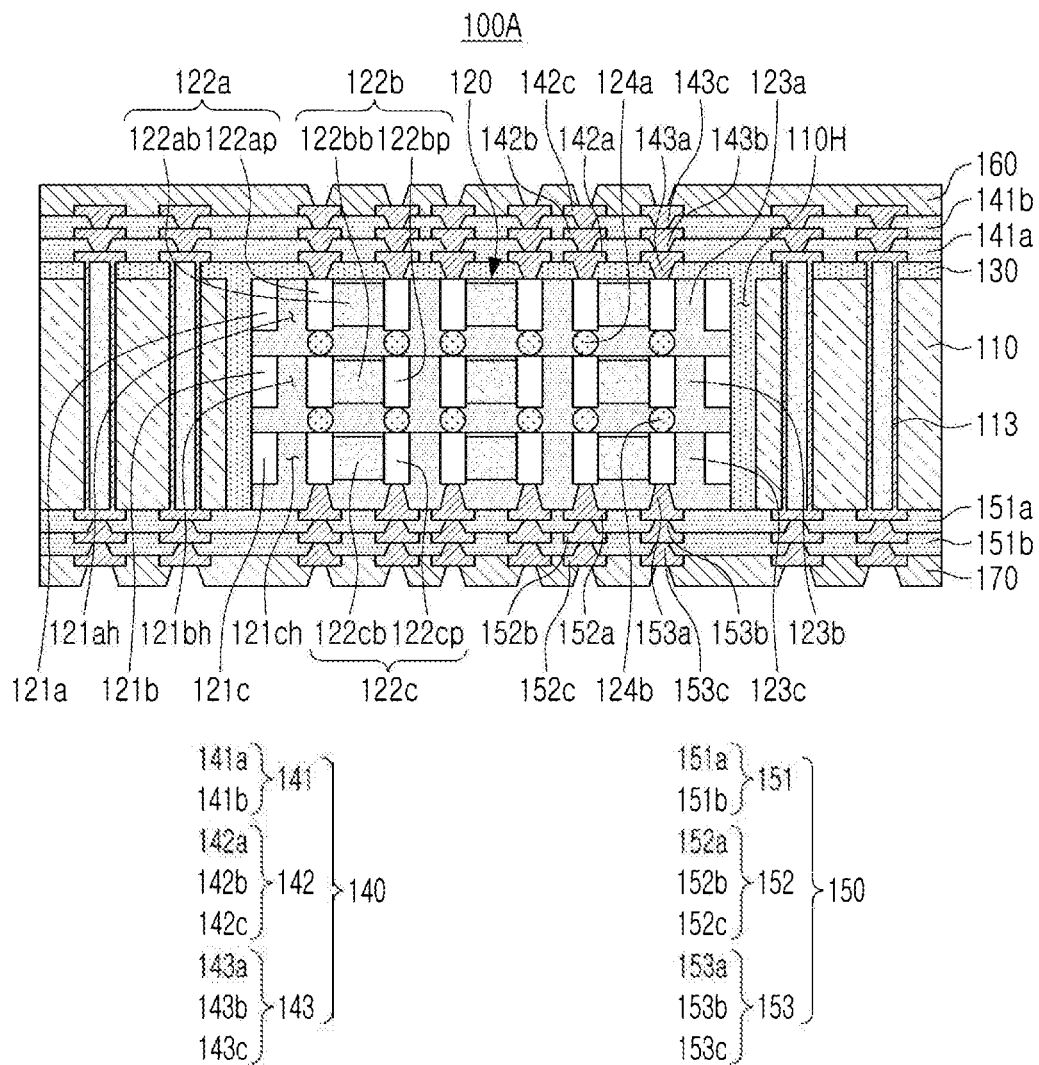
FIG. 3 is a schematic cross-sectional view of an electronic component-embedded substrate 100A according to an example.

FIG. 3 is a schematic cross-sectional view of an electronic component-embedded substrate 100A according to an example.

Referring to FIG. 3, the electronic component-embedded substrate 100A according to an example may include a core member 110 having a cavity 110H, an electronic component module 120 disposed in the cavity 110H, an insulating material 130 covering at least a portion of each of the core member 110 and the electronic component module 120, a first build-up structure 140 disposed on one side of the core member 110 and the insulating material 130 and including wiring layers 142a to 142c, a second build-up structure 150 disposed on the other side of the core member 110 and including wiring layers 152a to 152c, a through-via 113 penetrating through the core member 110, a first passivation layer 160 disposed on the first build-up structure 140, and a second passivation layer 170 disposed on the second build-up structure 150. If necessary, the electronic component-embedded substrate 100A may further include an electrical connection metal (not illustrated) disposed in respective openings of a first passivation layer 160 and a second passivation layer 170, which will be described later.

In the present specification, an upper surface of the electronic component module is described as a first surface and a lower surface thereof is described as a second surface with reference to the drawings. In addition, the linear direction connecting the first surface and the second surface is described as the thickness direction.

In the present specification, the meaning of being disposed on any component is not limited to the direction of being disposed on the upper side or the upper surface of any component, and in some cases, may be the case disposed on the lower or lower surface of any component.

As described below, the electronic component-embedded substrate 100A includes an electronic component module 120 having a plurality of electronic components 122a to 122c stacked in a vertical direction and connected to each other in parallel.

The electronic component module 120 may be connected to a semiconductor package (not illustrated) mounted on the electronic component-embedded substrate 100A by the wiring layers 142a to 142c included in a first build-up structure 140. Therefore, an electrical connection path between the plurality of electronic components 122a to 122c included in the electronic component module 120, and the semiconductor package (not illustrated), may be shortened. In addition, electrical signal loss and the like may be significantly reduced.

In addition, the plurality of electronic components 122a to 122c included in the electronic component module 120 may be arranged in the vertical and horizontal directions. Therefore, the mounting density of the plurality of electronic components 122a to 122c mounted on the electronic component module 120 may be increased to embed a plurality of electronic components.

As described below, the yield may be improved by prefabricating the electronic component module 120 including the plurality of electronic components 122a to 122c and embedding the same in the substrate. In addition, a test may be performed before the prefabricated electronic component module 120 is embedded in the substrate, and the defective rate may be reduced by selectively embedding the electronic component module 120 in the substrate.

In addition, the plurality of electronic components 122a to 122c included in the electronic component module 120 may be mounted in the cavity 110H of a core member 110, approximately symmetrically in the thickness direction, as illustrated in the drawing. Therefore, the warpage or the like of the substrate may be reduced.

As described below, the plurality of electronic components 122a to 122c may be passive components respectively having an electrode, and the passive components may be connected to each other in parallel by connection conductors 124a and 124b. Since the passive components are directly connected in parallel by the connection conductors 124a and 124b, not only the generation of noise due to the introduction of a separate wiring layer may be suppressed, but also the capacitance may be increased.

Figure 8:
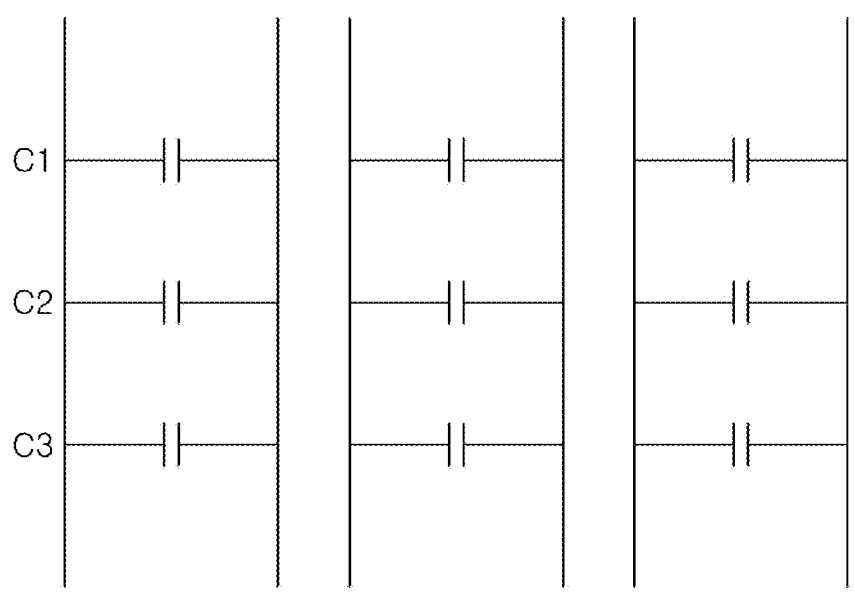
FIG. 8 schematically illustrates an internal circuit diagram of an electronic component module 120 included in the electronic component-embedded substrate 100A according to an example.

FIG. 8 schematically illustrates a circuit diagram of the plurality of electronic components 122a to 122c included in the electronic component module 120. In this case, the capacitance values of first electronic component 122a, second electronic component 122b, and third electronic component 122c are denoted by C1, C2, and C3, respectively. As illustrated in the figure, as the first electronic component 122a, the second electronic component 122b, and the third electronic component 122c are connected to each other in parallel, the value of the total capacitance may be increased to C1+C2+C3. In this case, as illustrated in the drawing, each of the first electronic component 122a, the second electronic component 122b and the third electronic component 122c is illustrated as a case of a plurality of electronic components.

Hereinafter, each configuration of the electronic component-embedded substrate 100A according to an example will be described in more detail.

The core member 110 may serve to promote rigidity of the substrate by reducing warpage of the substrate. The material for forming the core member 110 is not particularly limited, and any material may be used as long as the material has insulation. For example, thermosetting resins such as epoxy resins, thermoplastic resins such as polyimide, or resins in which these resins further contain a reinforcing material such as an inorganic filler and/or glass cloth or glass fabric, for example, a prepreg, Ajinomoto Build-up Film (ABF), FR-4, Bismaleimide Triazine (BT) and the like may be used. If necessary, Photo Imagable Dielectric (PID) resins may be used.

The through-via 113 penetrates through the core layer 110, and the through-via 113 may connect the wiring layers 142a to 142c included in the first build-up structure 140 and the wiring layers 152a to 152c included in the second build-up structure 150 to each other. The through-via 113 may also further penetrate through the insulating material 130 as illustrated in the figure.

Examples of the material for forming the through-via 113 include a conductive material such as copper (Cu), aluminum (Al), silver (Ag), tin (Sn), gold (Au), nickel (Ni), lead (Pb), titanium (Ti), or alloys thereof. The through-via 113 may be formed by completely filling a via hole with a conductive material, or may be formed as a conductive material formed along the wall of the via hole. For example, when the conductive material is formed along the wall of the via hole to form the through-via 113, the via hole may be filled with an insulating material as illustrated in the drawing. In addition, the shape of the through-via 113 may be any shape known in the art, such as a tapered shape, a cylindrical shape.

The electronic component module 120 includes a first support member 121a having a first through-portion 121ah, a first electronic component 122a disposed in the first through-portion 121ah, a first resin layer 123a covering at least a portion of each of the first support member 121a and the first electronic component 122a, a second support member 121b disposed on the first support member 121a and having a second through-portion 121bh, a second electronic component 122b disposed on the second support member 121b, a second resin layer 123b covering at least a portion of each of the second support member 121b and the second electronic component 122b, a third support member 121c disposed on the second support member 121b and having a third through-portion 121ch, a third electronic component 122c disposed on the third support member 121c, a third resin layer 123c covering at least a portion of each of the third support member 121c and the third electronic component 122c, a first connection conductor 124a embedded in the first resin layer 123a and connecting the first electronic component 122a and the second electronic component 122b, and a second connection conductor 124b embedded in the second resin layer 123b and connecting the second electronic component 122b and the third electronic component 122c.

In this case, the first support member 121a and the first electronic component 122a are disposed in the cavity 110H in a direction facing the first build-up structure 140, and the third support member 121c and the third electronic component 122c are disposed in the cavity 110H in a direction facing the second build-up structure 150. In this case, at least a portion of each of the first support member 121a and the first electronic component 122a may be exposed to the first surface of the electronic component module 120 as illustrated.

As illustrated in the figure, each of the first electronic component 122a, the second electronic component 122b and the third electronic component 122c may be a plurality of electronic components. In this case, the plurality of first electronic components 122a may be disposed in the first through-portion 121ah to be spaced apart from each other by a predetermined distance. In addition, the space between the plurality of first electronic components 122a may be filled with the first resin layer 123a. Therefore, the plurality of first electronic components 122a may be spaced apart from each other by the first resin layer 123a. In addition, the plurality of second electronic components 122b and the plurality of third electronic components 122c may also be disposed in the same or similar manner as the plurality of first electronic components 122a1 to 122a3, respectively.

However, the structure of the electronic component module 120 is not limited thereto, and the electronic component module 120 may be changed by those skilled in the art. For example, the numbers of the support members, the electronic components, the resin layers, and the connection conductor included in the electronic component module 120 may be more or less than that illustrated in the drawings.

The material for forming each of the first support member 121a, the second support member 121b, and the third support member 121c is not particularly limited, and any material may be used as long as the material has insulation. For example, thermosetting resins such as epoxy resins, thermoplastic resins such as polyimide, or resins in which these resins further contain a reinforcing material such as an inorganic filler and/or glass cloth or glass fabric, for example, a prepreg, Ajinomoto Build-up Film (ABF), FR-4, Bismaleimide Triazine (BT) and the like may be used. If necessary, Photo Imagable Dielectric (PID) resins may be used.

The forming materials of each of the first support member 121a, the second support member 121b, and the third support member 121c may be the same or may be different from each other. In addition, the thicknesses of the first support member 121a, the second support member 121b, and the third support member 121c may be the same or may be different from each other.

The first through-portion 121ah, the second through-portion 121bh, and the third through-portion 121ch may penetrate through the entirety or portions of the first support member 121a, a second support member 121b, and a third support member 121c, respectively. The first through-portion 121ah, the second through-portion 121bh, and the third through-portion 121ch may be formed using a sandblasting method using abrasive particles, a dry etching method using plasma, a mechanical drill and/or a laser drill, or the like.

Each of the first electronic component 122a, the second electronic component 122b, and the third electronic component 122c may be a chip type capacitor having an electrode. For example, the first electronic component 122a, the second electronic component 122b, and the third electronic component 122c may be multi-layer ceramic capacitors (MLCCs), but are not limited thereto. In this case, electrodes may be connected in parallel by the first connection conductor 124a or the second connection conductor 124b. For example, each of the first electronic component 122a, the second electronic component 122b, and the third electronic component 122c may include a first electrode and a second electrode, and the first electrodes of the first electronic component 122a, the second electronic component 122b and the third electronic component 122c are connected to each other, and the second electrodes of the first electronic component 122a, the second electronic component 122b, and the third electronic component 122c are connected to each other. However, examples thereof are not limited thereto, and the first electronic component 122a, the second electronic component 122b, and the third electronic component 122c may be respective a passive component such as an inductor, and may be an active component such as an integrated circuit (IC) or a semiconductor chip.

The first electronic component 122a, the second electronic component 122b, and the third electronic component 122c are disposed in the thickness direction of the first electronic component 122a, the second electronic component 122b, and the third electronic component 122c, respectively, and may be stacked to overlap each other on a plane. For example, on the plane, the second electronic component 122b is disposed on the first electronic component 122a to overlap the first electronic component 122a, and the third electronic component 122c is disposed on the second electronic component 122b to overlap the second electronic component 122b.

The first resin layer 123a, the second resin layer 123b, and the third resin layer 123c may cover at least portions of the first electronic component 122a, the second electronic component 122b, and the third electronic component 122c, respectively. In addition, the first resin layer 123a, the second resin layer 123b, and the third resin layer 123c may fill at least portions of the first through-portion 121ah, the second through-portion 121bh, and the third through-portion 121ch, respectively, and may cover at least portions of the first support member 121a, the second support member 121b, and the third support member 121c, respectively.

The forming material of each of the first resin layer 123a, the second resin layer 123b, and the third resin layer 123c is not particularly limited, and any material may be used as long as it has insulating properties. For example, thermosetting resins such as epoxy resins, thermoplastic resins such as polyimide, or resins in which these resins further contain a reinforcing material such as an inorganic filler and/or glass cloth or glass fabric, for example, a prepreg, Ajinomoto Build-up Film (ABF), FR-4, Bismaleimide Triazine (BT) and the like may be used. If necessary, Photo Imagable Dielectric (PID) resins may be used.

The boundary between the first resin layer 123a, the second resin layer 123b, and the third resin layer 123c may not be distinguished depending on each material and process of the first resin layer 123a, the second resin layer 123b, and the third resin layer 123c. For example, the first resin layer 123a, the second resin layer 123b, and the third resin layer 123c are integrated with each other or the interface therebetween is unclear in the lamination process described later, such that it may be difficult to identify the interface. In some cases, only some of the first resin layer 123a, the second resin layer 123b, and the third resin layer 123c may have an interface.

In addition, the first resin layer 123a, the second resin layer 123b, and the third resin layer 123c may be spaced apart from each other by a predetermined distance in the stacking direction, depending on the heights of the first connection conductor 124a and the second connection conductor 124b, differently from those illustrated in the drawing. In this case, the insulating material 130 may fill at least a portion of the space between the first resin layer 123a, the second resin layer 123b, and the third resin layer 123c.

The first connection conductor 124a connects the first electronic component 122a and the second electronic component 122b to each other, and the second connection conductor 124b connects the second electronic component 122b and the third electronic component 122c to each other. The first connection conductor 124a may be disposed at a level between the first electronic component 122a and the second electronic component 122b. In addition, at least a portion of the first connection conductor 124a may be embedded in the first resin layer 123a. Similarly, the second connection conductor 124b is disposed at a level between the second electronic component 122b and the third electronic component 122c, and at least a portion of the second connection conductor 124b may be embedded in the second resin layer 123b.

As described above, the first resin layer 123a, the second resin layer 123b, and the third resin layer 123c may be spaced apart from each other depending on the height of the first connection conductor 124a and the second connection conductor 124b. The insulating material 130 may fill at least a portion of the space between the first resin layer 123a, the second resin layer 123b, and the third resin layer 123c. In this case, at least a portion of each of the first connection conductor 124a and the second connection conductor 124b may be covered with the insulating material 130.

Each of the first connection conductor 124a and the second connection conductor 124b may include a solder and/or a conductive paste, but an example thereof is not limited thereto. As the material for forming each of the first and second connection conductors 124a and 124b, any conductive material capable of electrically connecting the first electronic component 122a and the second electronic component 122b and electrically connecting the second electronic component 122b and the third electronic component 122c may be used.

The material for forming the insulating material 130 is not particularly limited, and any material may be used as long as it has insulating properties. For example, thermosetting resins such as epoxy resins, thermoplastic resins such as polyimide, or resins in which these resins further contain a reinforcing material such as an inorganic filler and/or glass cloth or glass fabric, for example, a prepreg, Ajinomoto Build-up Film (ABF), FR-4, Bismaleimide Triazine (BT) and the like may be used. If necessary, Photo Imagable Dielectric (PID) resins may be used.

The boundary between the insulating material 130 and the first resin layer 123a in contact with the insulating material 130, the second resin layer 123b, and/or the third resin layer 123c may not be distinguished depending on materials and processes of the insulating material 130, the first resin layer 123a, the second resin layer 123b, and the third resin layer 123c. For example, during the lamination process, the insulating material 130 is integrated with the first resin layer 123a, the second resin layer 123b, and/or the third resin layer 123c, or the boundary thereof is unclear, and thus, it may be difficult to visually determine the boundary thereof in the completed electronic component-embedded substrate. In some cases, the insulating material 130 may only have an interface with a portion of the first resin layer 123a, the second resin layer 123b, and the third resin layer 123c. For example, the insulating material 130 and the first resin layer 123a may have an interface, and the insulating material 130, the second resin layer 123b, and the third resin layer 123c may have an integrated structure without a boundary surface.

The first build-up structure 140 includes a first wiring layer 142a disposed on the insulating material 130, a first via 143a penetrating through the insulating material 130 and connecting the first wiring layer 142a to the electronic component module 120, a first insulating layer 141a disposed on the insulating material 130 and covering the first wiring layer 142a, a second wiring layer 142a disposed on the first insulating layer 141a, a second via 143b penetrating through the first insulating layer 141a and connecting the first wiring layer 142a and the second wiring layer 142b, a second insulating layer 141b disposed on the first insulating layer 142a and covering the second wiring layer 142a, a third wiring layer 142c disposed on the second insulating layer 141b, and a third via 143c penetrating through the second insulating layer 141b and connecting the second wiring layer 142b and the third wiring layer 142c.

However, the structure of the first build-up structure 140 is not limited thereto, and may be changed by those skilled in the art. For example, the numbers of insulating layers, wiring layers, and/or vias included in the first build-up structure 140 may be more or less than that illustrated in the drawings.

The forming material of each of the first and second insulating layers 141a and 141b is not particularly limited, and any material may be used as long as it has insulating properties. For example, thermosetting resins such as epoxy resins, thermoplastic resins such as polyimide, or resins in which these resins further contain a reinforcing material such as an inorganic filler and/or glass cloth or glass fabric, for example, a prepreg, Ajinomoto Build-up Film (ABF), FR-4, Bismaleimide Triazine (BT) and the like may be used. If necessary, Photo Imagable Dielectric (PID) resins may be used.

The boundary between the first and second insulating layers 141a and 141b may not be distinguished depending on the material and the process of each of the first and second insulating layers 141a and 141b. For example, the first and second insulating layers 141a and 141b are integrated with each other or the interface thereof is unclear during the lamination process, so it may be difficult to visually identify the interface in the completed electronic component-embedded substrate structure.

In addition, the boundary between the first insulating layer 141a and the insulating material 130 in contact with the first insulating layer 141a may not be distinguished depending on the material and process of the insulating layer of each of the first insulating layer 141a and the insulating material 130. For example, during the lamination process, the first insulating layer 141a and the insulating material 130 may be integrated with each other or the interface therebetween may be unclear, and thus, it may be difficult to visually identify the boundary surface in the completed electronic component-embedded substrate structure.

As the material for forming each of the first to third wiring layers 142a to 142c, a conductive material such as copper (Cu), aluminum (Al), silver (Ag), tin (Sn), gold (Au), nickel (Ni), lead (Pb), titanium (Ti), or alloys thereof may be used. The first to third wiring layers 142a to 142c may respectively perform various functions depending on a design. For example, the first to third wiring layers 142a to 142c may include a ground (GrouND) pattern, a power (PoWeR: PWR) pattern, a signal (S) pattern, and the like. In this case, the signal S pattern includes various signals except for a ground GND pattern and a power PWR pattern, for example, includes a data signal or the like, and in addition, may include a via pad or the like.

The first wiring layer 142a is connected to the electronic component module 120 by the first via 143a penetrating through the insulating material 130. In detail, a portion of the pattern included in the first wiring layer 142a may be connected to the first electronic component 122a of the electronic component module 120 by the first via 143a.

In this case, when the first electronic component 122a includes a body 122ab and an electrode 122ap, a portion of the pattern included in the first wiring layer 142a may be connected to the electrode 122ap of the first electronic component 122a.

The first wiring layer 142a is also connected to the through-via 113. Therefore, a portion of the pattern included in the first wiring layer 142a may be connected to the wiring layers 152a through 152c included in the second build-up structure 151, to be described later, by the through-via 113.

As the material for forming each of the first to third vias 143a to 143c, a conductive material such as copper (Cu), aluminum (Al), silver (Ag), tin (Sn), gold (Au), nickel (Ni), lead (Pb), titanium (Ti), or alloys thereof may be used. The first to third vias 143a to 143c may be respectively completely filled with a conductive material, or may be formed as the conductive material is formed along a wall of the via. For example, in the case in which the via is formed as a conductive material is formed along the wall of the via hole, the via hole interior may be filled with an insulating material. In addition, as the shapes of the first to third vias 113a to 113c, all shapes known in the art, such as a tapered shape and a cylindrical shape, may be used.

The second build-up structure 150 includes a first wiring layer 152a disposed on the core member 110, a first via 153a penetrating through the third resin layer 123c and connecting the first wiring layer 152a to the electronic component module 120, a first insulating layer 151a disposed on the core member 110 and covering the first wiring layer 152a, a second wiring layer 152b disposed on the first insulating layer 151a, a second via 153b penetrating through the first insulating layer 151a and connecting the first wiring layer 152a and the second wiring layer 152b, a second insulating layer 151b disposed on the first insulating layer 152a and covering the second wiring layer 152a, a third wiring layer 152c disposed on the second insulating layer 151b, and a third via 153c penetrating through the second insulating layer 151b and connecting the second wiring layer 152b and the third wiring layer 152c.

However, the structure of the second build-up structure 150 is not limited thereto, and may be changed by those skilled in the art. For example, the numbers of insulating layers, wiring layers, and/or vias included in the second build-up structure 150 may be more or less than illustrated in the drawings.

The forming material of each of the first and second insulating layers 151a and 151b is not particularly limited, and any material may be used as long as it has insulating properties. For example, thermosetting resins such as epoxy resins, thermoplastic resins such as polyimide, or resins in which these resins further contain a reinforcing material such as an inorganic filler and/or glass cloth or glass fabric, for example, a prepreg, Ajinomoto Build-up Film (ABF), FR-4, Bismaleimide Triazine (BT) and the like may be used. If necessary, Photo Imagable Dielectric (PID) resins may be used.

The boundary between the first and second insulating layers 151a and 151b may not be distinguished depending on materials and processes of the first and second insulating layers 151a and 151b. For example, the first and second insulating layers 151a and 151b are integrated with each other or the interface thereof is unclear during the lamination process, and thus, it may be difficult to visually identify the interface in the completed electronic component-embedded substrate structure.

In addition, the boundary between the first insulating layer 151a and the insulating material 130 and/or the third resin layer 153a in contact with the first insulating layer 151a may not be distinguished depending on materials and processes of the first insulating layer 151a, the third resin layer 153a and the insulating material 130. For example, during the lamination process, the first insulating layer 151a is integrated with the third resin layer 153a and/or the insulating material 130 or the interface thereof is unclear, and thus, it may be difficult to visually identify the interface thereof.

As the material for forming each of the first to third wiring layers 152a to 152c, a conductive material such as copper (Cu), aluminum (Al), silver (Ag), tin (Sn), gold (Au), nickel (Ni), lead (Pb), titanium (Ti), or alloys thereof may be used. The first to third wiring layers 152a to 152c may respectively perform various functions depending on a design. For example, the first to third wiring layers 152a to 152c may include a ground (GrouND: GND) pattern, a power (PoWeR: PWR) pattern, a signal (Signal: S) pattern, and the like. In this case, the signal S pattern includes various signals except for a ground GND pattern, a power PWR pattern, and the like, for example, a data signal or the like, and in addition, may include a via pad or the like.

The first wiring layer 152a is connected to the electronic component module 120 by the first via 153a penetrating through the third resin layer 123c. In detail, a portion of the pattern included in the first wiring layer 152a may be connected to the third electronic component 122c of the electronic component module 120 by the first via 153a. In this case, in the case in which the third electronic component 122c includes a body 122cb and an electrode 122cp, a portion of the pattern included in the first wiring layer 152a may be connected to the electrode 122cp of the third electronic component 122c.

The first wiring layer 152a is also connected to the through-via 113. Therefore, a portion of the pattern included in the first wiring layer 152a may be connected to the wiring layers 142a through 142c included in the first build-up structure 141 by the through-via 113.

As the material for forming each of the first to third wiring layers 153a to 153c, a conductive material such as copper (Cu), aluminum (Al), silver (Ag), tin (Sn), gold (Au), nickel (Ni), lead (Pb), titanium (Ti), or alloys thereof may be used. The first to third vias 153a to 153c may be respectively and completely filled with a conductive material, or may be formed as the conductive material formed along the walls of the vias. For example, in the case in which the via is formed as a conductive material is formed along the walls of the via holes, the via hole interior may be filled with an insulating material. In addition, as the shapes of the first to third vias 113a to 113c, all shapes known in the art, such as a tapered shape and a cylindrical shape, may be used.

The first and second passivation layers 160 and 170 may protect the internal configuration of the electronic component-embedded substrate 100A from external physical and chemical damage. Each of the first and second passivation layers 160 and 170 may include a thermosetting resin and an inorganic filler. For example, each of the first and second passivation layers 160 and 170 may be an ABF layer. However, an example thereof is not limited thereto, and the first and second passivation layers 150 and 160 may be photoimagable dielectric layers known in the art, for example, solder resist (SR) layers. The first and second passivation layers 160 and 170 may include the same type of material, and may have substantially the same thickness. However, an example thereof is not limited thereto, and may include different types of materials, and may also have different thicknesses.

The first passivation layer 160 may have one or more openings (not illustrated) that expose at least a portion of the wiring layer 142c of the first build-up structure 140. The second passivation layer 170 may have one or more openings (not illustrated) that expose at least a portion of the wiring layer 142c of the second build-up structure 150. In this case, a surface treatment layer may be formed on the respective surfaces of the exposed wiring layers 142c and 152c. The surface treatment layer may be formed by, for example, gold plating, tin plating, silver plating, nickel plating, or the like. If necessary, the opening of each of the first and second passivation layers 160 and 170 may be comprised of a plurality of via holes.

In one example, the second support member 121b, the second electronic component 122b embedded in the second support member 121b, and the second resin layer 123b covering portions of the second support member 121b and the second electronic component 122b may be omitted. In this case, one of the first connection conductor 124a and the second connection conductor 124b may be omitted, and the first electronic component 122a and the third electronic component 122c may be connected to each other by another of the first connection conductor 124a and the second connection conductor 124b.

FIGS. 4A to 5E schematically illustrate a manufacturing process of the electronic component-embedded substrate 100A according to an example.

Figure 4A:
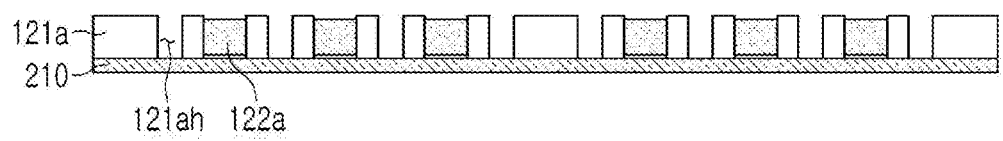
FIGS. 4A to 5E schematically illustrate a manufacturing process of the electronic component-embedded substrate 100A according to an example.

Referring to FIG. 4A, first, a first through-portion 121ah is formed in the first support member 121a, and a first adhesive member 210 is attached to one surface of the first support member 121a. Next, the first electronic component 122a is disposed in the through-portion 121ah.

The first through-portion 121ah may be formed by a sandblasting method using abrasive particles, a dry etching method using plasma, a mechanical drill and/or a laser drill, or the like. When the first through-portion 121ah is formed using a mechanical drill and/or a laser drill, the desmearing process, such as a permanganate method, is performed to remove the resin smearing in the first through-portion 121ah.

The material of the first adhesive member 210 is not particularly limited, and any material may be used as long as the first electronic component 122a can be fixed to the first support member 121a by using the material. For example, a well-known tape or the like may be used. As an example of a well-known tape, the heat-hardenable adhesive tape which weakens an adhesive force by heat processing, the ultraviolet curable adhesive tape which weakens an adhesive force by ultraviolet irradiation, or the like, may be provided.

The first electronic component 122a may be disposed in a manner of attaching the first electronic component 122a to the first adhesive member 210 exposed by the first through-portion 121ah. The first electronic component 122a may be disposed to be spaced apart from the first support member 121a by a predetermined distance. When the first electronic component 122a is provided as a plurality of first electronic components 122a, the plurality of first electronic components 122a may also be disposed to be spaced apart from each other by a predetermined distance.

Figure 4B:
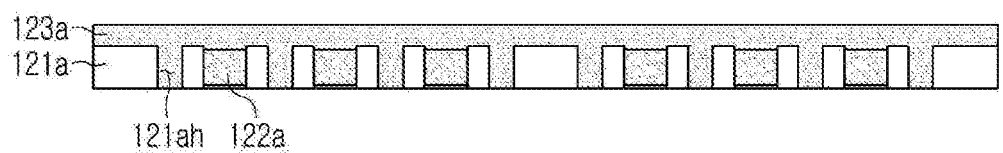

Next, referring to FIG. 4B, the first resin layer 123a is formed and the first adhesive member 210 is peeled off.

The first resin layer 123a fills at least a portion of the first through-portion 121ah and is formed to cover at least a portion of each of the first support member 121a and the first electronic component 122a. The first resin layer 123a may be formed by a known method. For example, the first resin layer 123a may be formed using a method in which the precursor of the first resin layer 123a is laminated by a known lamination method and is then cured or a method in which the precursor material is applied using a known coating method and is then cured.

The peeling method of the first adhesive member 210 is not particularly limited and may be performed by a known method. For example, in the case in which the heat-hardenable adhesive tape which weakens an adhesive force by heat processing, the ultraviolet curable adhesive tape which weakens an adhesive force by ultraviolet irradiation, or the like is used, the peeling of the adhesive member may be performed after performing the heat treatment on the first adhesive member 210 to weaken the adhesive force, or may be performed after the adhesive force is weakened by irradiating the first adhesive member 210 with ultraviolet rays.

Figure 4C:
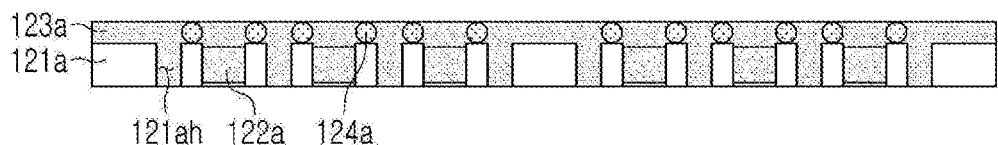

Next, referring to FIG. 4C, via holes are formed in the first resin layer 123a using a mechanical drill and/or a laser drill, or the like, and the first connection conductor 124a is formed in respective via holes.

The first connection conductor 124a may be formed by a known method, and for example, may be formed using a method in which the conductive paste is applied to the respective via holes by a screen printing method.

Figure 4D:
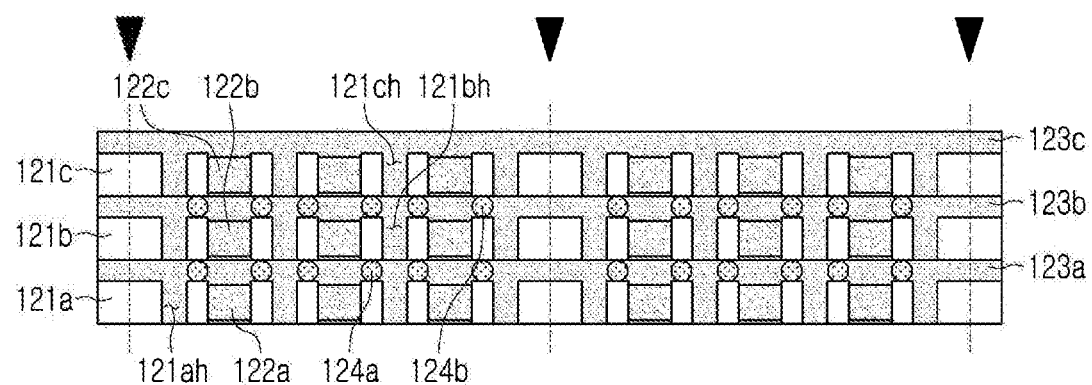
Figure 4E:
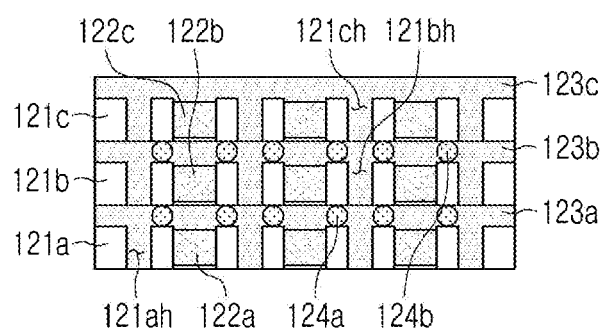

Next, referring to FIGS. 4D to 4E, a structure in which the second electronic component 122b is disposed in the second through-portion 121bh of the second support member 121b and is covered with the second resin layer 123b, and a structure in which the third electronic component 122c is disposed in the third through-portion 121ch of the third support member 121c and is covered with the third resin layer 123c, are prepared respectively. The forming method thereof is the same as the foregoing method of forming the structure in which the first electronic component 122a is disposed in the first through-portion 121ah of the first support member 121a and is covered with the first resin layer 123a. Thereafter, on the structure in which the first electronic component 122a is disposed in the first through-portion 121ah of the first support member 121a and is covered with the first resin layer 123a, sequential stacking may be performed. Then, the laminated substrate is cut to form a single electronic component module 120. In this case, only a single electronic component module 120 may also be formed from the beginning, and in this case, the above-described cutting process is unnecessary.

Figure 5A:
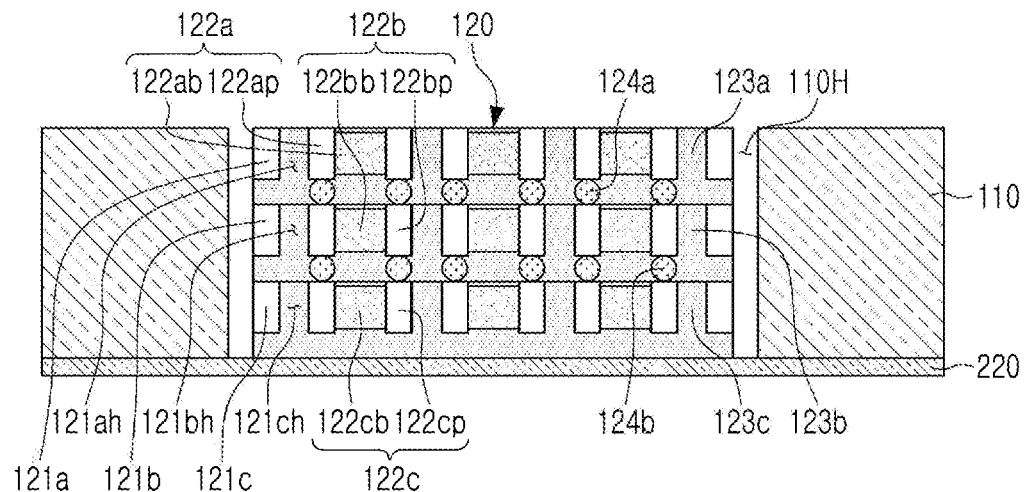

Referring to FIG. 5A, first, the cavity 110H is formed in the core member 110, and a second adhesive member 220 is attached to one surface of the core member 110. Next, the electronic component module 120 is disposed in the cavity 110H. The method used in this process is the same as described in FIG. 4A.

Figure 5B:
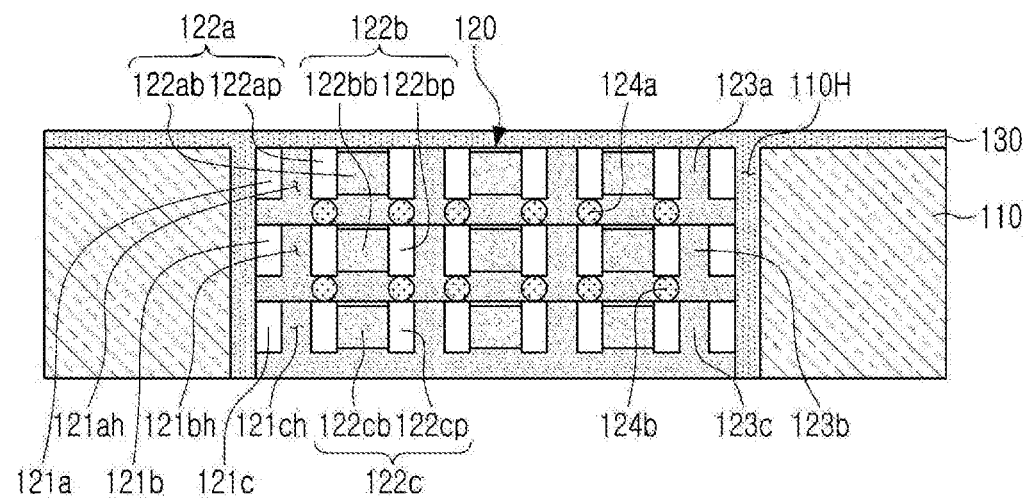

Next, referring to FIG. 5B, an insulating material 130 is formed and the second adhesive member 220 is peeled off. The method used in this process is the same as described in FIG. 4B.

Figure 5C:
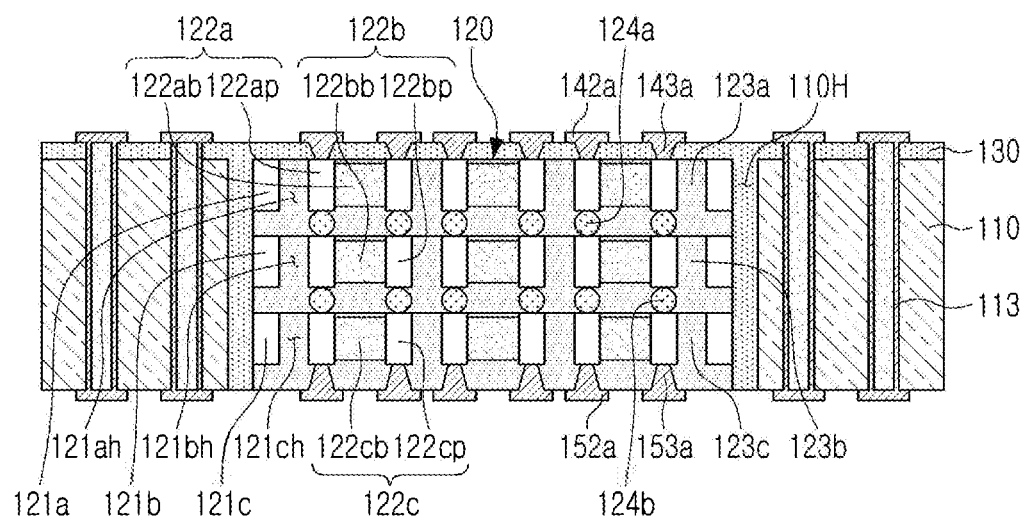

Next, referring to FIG. 5C, the through-via 113, the first via 143a and the first wiring layer 142a of the first build-up structure 140, and the first via 153a and the first wiring layer 152a of the second build-up structure 150 are formed, respectively.

The through-via 113, the first via 143a and the first wiring layer 142a of the first build-up structure 140, and the first via 153a and the first wiring layer 152a of the second build-up structure 150 may be formed by a known method. For example, through-via holes or via-holes are formed using photolithography, mechanical drills, and/or laser drills, and are then patterned by a dry film or the like, and the via-holes and patterned spaces are filled by a plating process or the like.

Figure 5D:
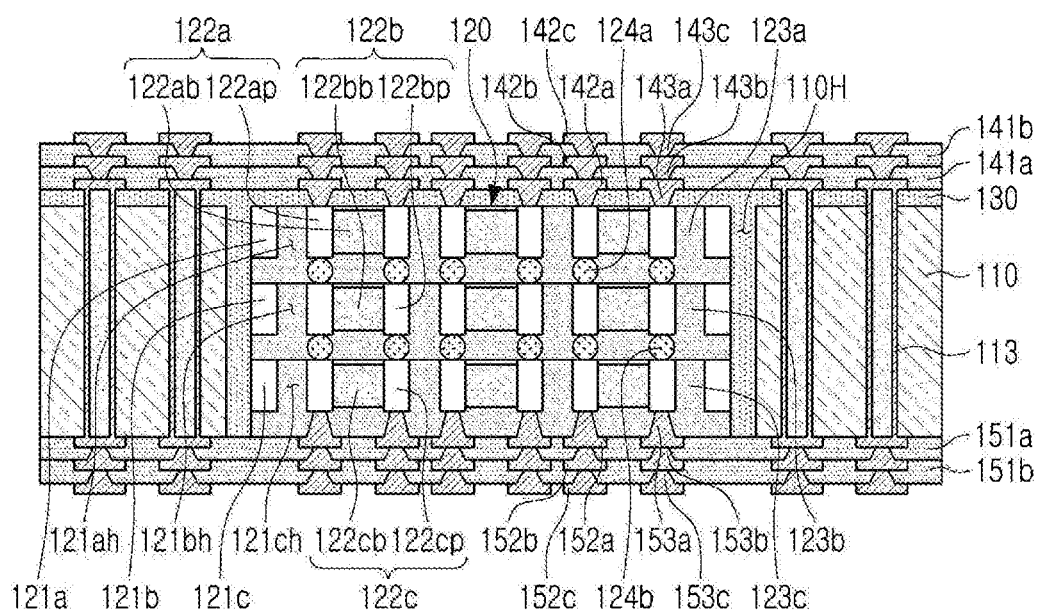

Next, referring to FIG. 5D, a plurality of insulating layers and a plurality of wiring layers are alternately stacked to form the first build-up structure 140 and the second build-up structure 150, respectively.

The respective insulating layers 141a, 141b, 151a and 151b may also be formed by a known method, for example, using a method in which the precursors of the insulating layers 141a, 141b, 151a and 151b are laminated using a known lamination method and then cured or a method in which the precursor material is applied by a known coating method and then cured.

The respective wiring layers 142a to 142c and 152a to 152c and the respective vias 143b, 143c, 153b and 153c are formed in the same manner as described with reference to FIG. 5C.

Figure 5E:
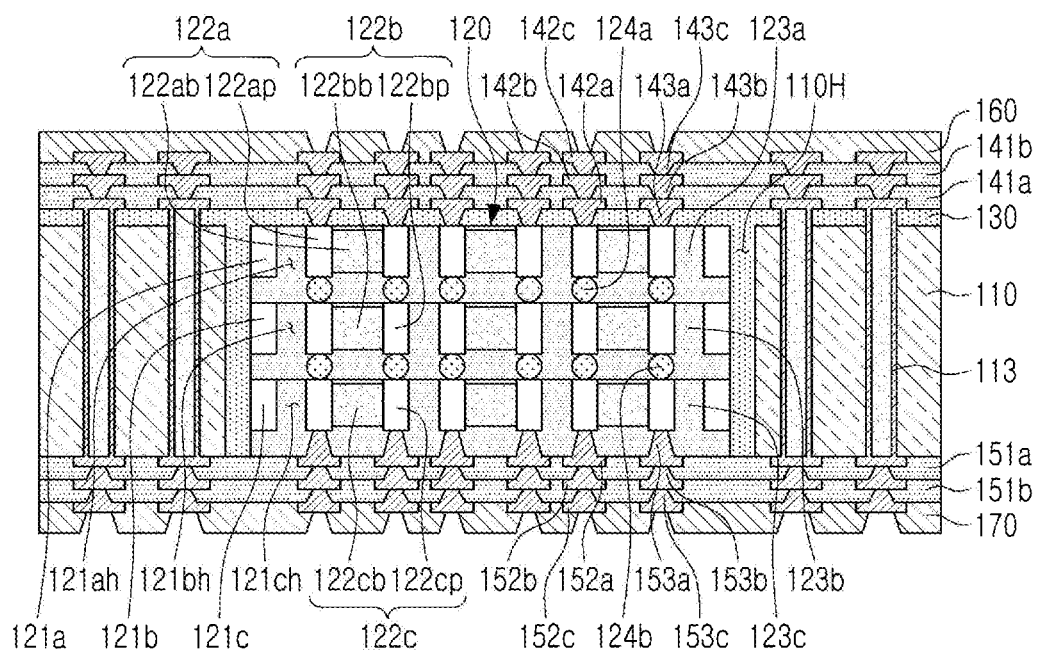

Next, referring to FIG. 5E, the first passivation layer 160 and the second passivation layer 170 are formed on the first build-up structure 140 and the second build-up structure 150, respectively, as necessary. The first passivation layer 160 and the second passivation layer 170 may also respectively be formed by a known method. For example, the method in which the respective precursors of the first passivation layer 160 and the second passivation layer 170 are laminated and then cured, the method of during after applying the material for forming the passivation layer 250, or the like may be used.

Figure 6:
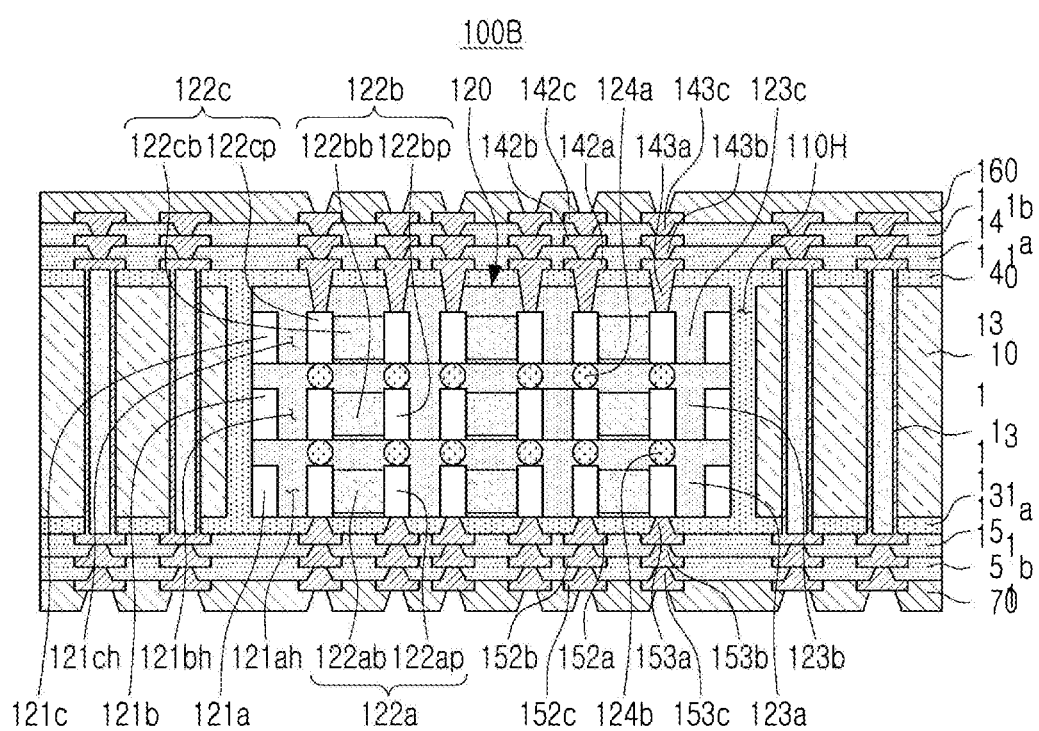
FIG. 6 is a schematic cross-sectional view of an electronic component-embedded substrate 100B according to another example.

FIG. 6 is a schematic cross-sectional view of an electronic component-embedded substrate 100B according to another example.

The electronic component-embedded substrate 100B according to another example is configured in such a manner that an electronic component module 120 is disposed in a cavity 110H of a core member 110 in a state in which the electronic component module 120 has rotated 180 degrees, as compared with the electronic component-embedded substrate 100A according to the example. For example, a first electronic component 122a is disposed to face a second build-up structure 150, and a third electronic component 122c is disposed to face a first build-up structure 140. Accordingly, the insulating material 130 covers at least a portion of the third resin layer 123c, and the first via 143a of the first build-up structure 140 penetrates through the insulating material 130 and further penetrates through the third resin layer 123c.

In addition, the electronic component-embedded substrate 100B according to another example may include a second insulating material 131 disposed between the core member 110 and the second build-up structure 150 in the electronic component-embedded substrate 100A according to the example. Accordingly, the first via 153a of the second build-up structure 150 penetrates through the second insulating material 131, and the through-via 113 penetrates through the core member 110 to further penetrate through the second insulating material 131. The boundary between the insulating material 130 and the second insulating material 131 may not be distinguished depending on materials and processes of the insulating material 130 and the second insulating material 131.

Other content is substantially the same as described in the electronic component-embedded substrate 100A according to the example, and thus, detailed descriptions thereof will be omitted.

Figure 7:
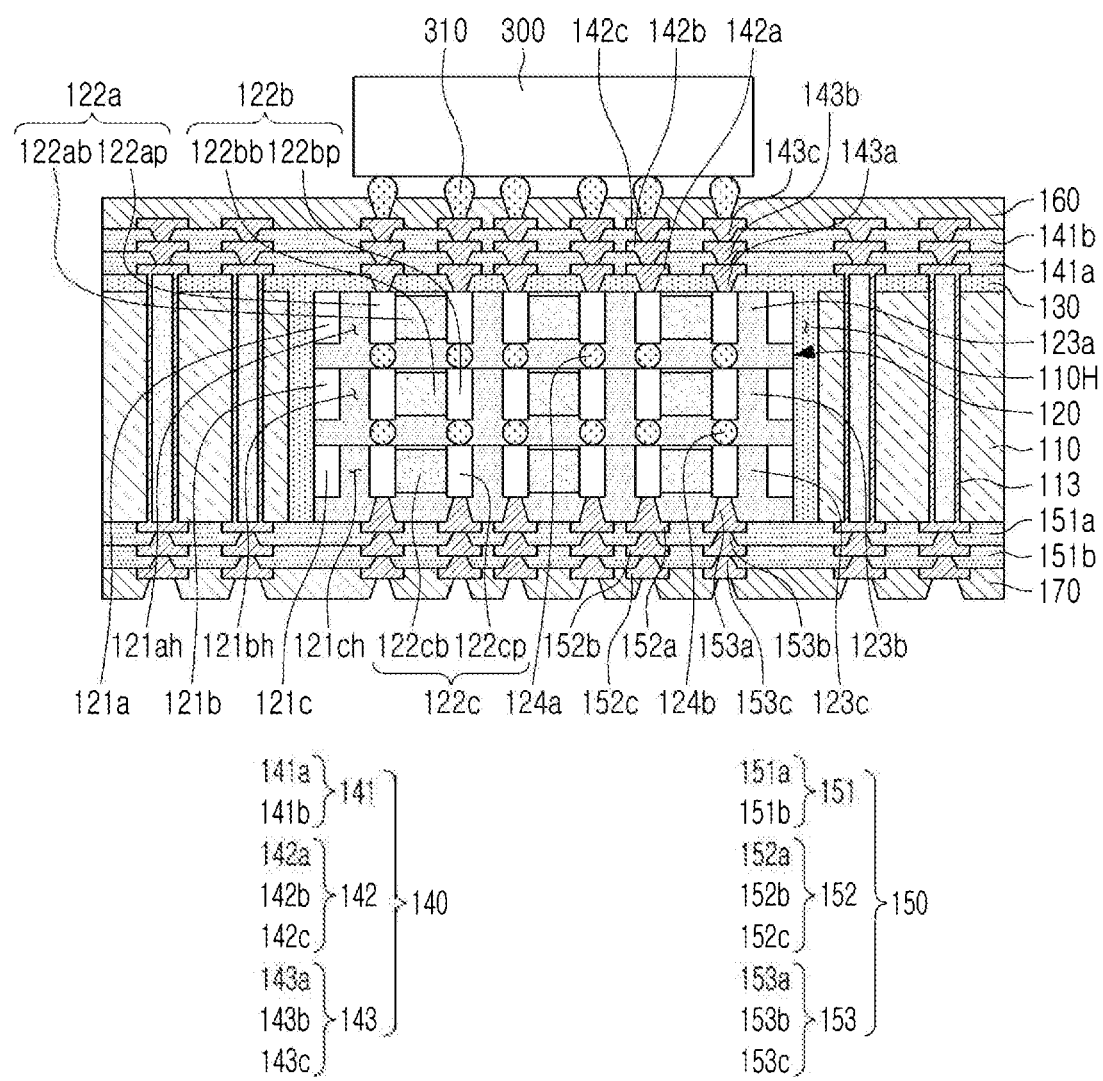
FIG. 7 is a schematic cross-sectional view of an example in which a semiconductor package is mounted on an electronic component-embedded substrate 100A according to an example.

FIG. 7 is a schematic cross-sectional view of an example in which a semiconductor package is mounted on an electronic component-embedded substrate 100A according to an example.

Referring to the drawings, in the case of using the above-described electronic component-embedded substrates 100A and 100B according to examples, a semiconductor package 300 is mounted on the electronic component-embedded substrate 100A or 100B by an electrical connection metal 310. In this case, the embedded electronic component 120 may be electrically connected to a semiconductor chip (not illustrated) included in the semiconductor package 300 by a significantly reduced and short electrical path.

In addition, the semiconductor package 300 may be formed to have a form in which a semiconductor chip (not illustrated) is mounted on a separate interposer substrate and packaged, but an example thereof is not limited thereto.

The semiconductor chip (not illustrated) may be an application specific integrated circuit (ASIC) and/or a high bandwidth memory (HBM), but is not limited thereto.

The electrical connection metal 310 may be formed of a low melting-point metal, for example, tin (Sn) or an alloy including tin (Sn). In detail, the electrical connection metal 310 may be formed of solder or the like, but this is only an example and the material is not particularly limited thereto.

In addition, the electrical connection metal 310 may be fixed with an under-fill resin, but an example thereof is not limited thereto.

On the other hand, the electronic component-embedded substrate 100A may be mounted on a main board (not illustrated) by a separate electrical connection metal (not illustrated).

As set forth above, according to an example, an electronic component-embedded substrate having a shortened electrical connection path may be provided.

As another effect among various effects of the present disclosure, an electronic component-embedded substrate having a plurality of electronic components embedded therein by increasing the mounting density of the electronic component may be provided.

As another effect, an electronic component-embedded substrate having improved yield may be provided.

In addition, an electronic component-embedded substrate in which warpage is reduced may be provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component-embedded substrate comprising:
   an electronic component module having a first surface and a second surface opposite to the first surface, and including a first support member having a first through-portion, a first electronic component disposed in the first through-portion, a first resin layer covering at least a portion of the first electronic component, a second support member disposed on one side of the first support member and having a second through-portion, a second electronic component disposed in the second through-portion and connected to the first electronic component, and a second resin layer covering at least a portion of the second electronic component;
   an insulating material covering at least a portion of each of a side surface and the first surface of the electronic component module; and
   a first wiring layer disposed on the insulating material and connected to the first electronic component,
   wherein the first electronic component and the second electronic component are electrically connected to each other by at least two connection conductors arranged therebetween in a thickness direction,
   wherein at least one of the first resin layer or the second resin layer is disposed between the at least two connection conductors in a direction perpendicular to the thickness direction, and
   wherein a via is disposed in the insulating material and directly connected to at least one of the first electronic component or the second electronic component.

2. The electronic component-embedded substrate of claim 1, wherein the first electronic component and the second electronic component are capacitors respectively having electrodes,
   wherein the electrodes are connected to each other in parallel.

3. The electronic component-embedded substrate of claim 2, wherein each of the electrodes comprises a first electrode and a second electrode,
   the first electrode of the first electronic component is connected to the first electrode of the second electronic component, and
   the second electrode of the first electronic component is connected to the second electrode of the second electronic component.

4. The electronic component-embedded substrate of claim 1, wherein at least one of the at least two connection conductors comprises at least one of a solder or a conductive paste.

5. The electronic component-embedded substrate of claim 1, wherein at least a portion of the at least two connection conductors is embedded in the first resin layer.

6. The electronic component-embedded substrate of claim 1, wherein the first electronic component and the second electronic component are disposed in a thickness direction of each of the first electronic component and the second electronic component.

7. The electronic component-embedded substrate of claim 6, wherein on a plane, the second electronic component is disposed to overlap the first electronic component.

8. The electronic component-embedded substrate of claim 1, wherein the first electronic component is provided as a plurality of first electronic components, and the plurality of first electronic components are disposed spaced apart from each other in the first through-portion, and
   the second electronic component is provided as a plurality of second electronic components, and the plurality of second electronic components are disposed spaced apart from each other in the second through-portion.

9. The electronic component-embedded substrate of claim 1, further comprising a core member having a cavity,
   wherein the electronic component module is disposed in the cavity.

10. The electronic component-embedded substrate of claim 9, further comprising:
    a first build-up structure including the first wiring layer; and a second build-up structure disposed on the second surface of the electronic component module and including a second wiring layer connected to the second electronic component.

11. The electronic component-embedded substrate of claim 10, wherein the first build-up structure further comprises a first via penetrating through the insulating material and connecting the first wiring layer and the first electronic component, and the second build-up structure further comprises a second via penetrating through the second resin layer and connecting the second wiring layer and the second electronic component.

12. The electronic component-embedded substrate of claim 11, wherein the first and second vias are tapered in directions opposite to each other.

13. The electronic component-embedded substrate of claim 10, further comprising a through-via penetrating through the core member and the insulating material and connecting the first wiring layer and the second wiring layer to each other.

14. The electronic component-embedded substrate of claim 1, further comprising a third electronic component disposed at a level between the first electronic component and the second electronic component.

15. The electronic component-embedded substrate of claim 14, wherein the first electronic component and the third electronic component are connected to each other by a first connection conductor, among the at least two connection conductors, comprising a solder or a conductive paste, and the second electronic component and the third electronic component are connected to each other by a second connection conductor, among the at least two connection conductors, comprising a solder or a conductive paste.

16. The electronic component-embedded substrate of claim 15, wherein the first electronic component is connected to the first wiring layer disposed on the first surface by a first via, and the second electronic component is connected to a second wiring layer disposed on the second surface by a second via.

17. The electronic component-embedded substrate of claim 1, wherein at least a portion of each of the first support member and the first electronic component is exposed to the first surface of the electronic component module.

* * * * *